(12) United States Patent
Brunschwiler et al.

(10) Patent No.: US 8,907,503 B2
(45) Date of Patent: Dec. 9, 2014

(54) MANUFACTURING AN UNDERFILL IN A SEMICONDUCTOR CHIP PACKAGE

(71) Applicant: International Business Machines Corporation, Armonk, NY (US)

(72) Inventors: Thomas J. Brunschwiler, Rueschlikon (CH); Javier V. Goicochea, Rueschlikon (CH); Stefano S. Oggioni, Segrate (IT); Gerd Schlottig, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/943,998

(22) Filed: Jul. 17, 2013

(65) Prior Publication Data

US 2014/0027932 A1 Jan. 30, 2014

(30) Foreign Application Priority Data

Jul. 27, 2012 (GB) .................................. 1213365.8

(51) Int. Cl.
*H01L 21/56* (2006.01)
*H01L 23/31* (2006.01)
*H01L 23/29* (2006.01)

(52) U.S. Cl.
CPC ....... *H01L 21/563* (2013.01); *H01L 2924/0002* (2013.01); *H01L 2224/16225* (2013.01); *H01L 23/3121* (2013.01); *H01L 2224/92125* (2013.01); *H01L 23/31* (2013.01); *H01L 23/295* (2013.01)
USPC ............ 257/787; 257/686; 257/777; 438/127

(58) Field of Classification Search
CPC . H01L 21/563; H01L 23/4012; H01L 25/043; H01L 25/0657; H01L 25/074; H01L 25/0756; H01L 25/117; H01L 2924/15151

USPC .................... 257/686, 777, 787; 438/127
See application file for complete search history.

(56) References Cited

U.S. PATENT DOCUMENTS

| | | | |
|---|---|---|---|
| 5,697,148 A | 12/1997 | Lance, Jr. et al. | |
| 6,016,006 A * | 1/2000 | Kolman et al. | ............... 257/712 |
| 6,214,635 B1 | 4/2001 | Akram et al. | |
| 6,546,620 B1 | 4/2003 | Juskey et al. | |
| 8,101,468 B2 | 1/2012 | Sugimura et al. | |

(Continued)

FOREIGN PATENT DOCUMENTS

| | | |
|---|---|---|
| DE | 102006003305 B3 | 8/2007 |
| GB | 2320612 A | 6/1998 |
| JP | 1092853 A | 4/1998 |
| JP | 1126641 | 1/1999 |
| JP | 2000040775 A | 2/2000 |
| JP | 2006269786 A | 10/2006 |

OTHER PUBLICATIONS

Intellectual Property Office, Application No. GB1213365.8; Patents Act 1977: Search Report Under Section 17(5); Date Mailed: Nov. 28, 2012, pp. 1-9.

*Primary Examiner* — Peniel M Gumedzoe
(74) *Attorney, Agent, or Firm* — Cantor Colburn LLP

(57) ABSTRACT

A method for manufacturing an underfill in a semiconductor chip stack having a cavity between a first surface and a second surface includes providing at least one access hole in one of the first or second surface; providing at least one vent hole in the one of the first or second surfaces; and applying a viscous filling material through the at least one access hole into the cavity thereby squeezing out air or gas through the at least one vent hole.

13 Claims, 8 Drawing Sheets

(56) References Cited

U.S. PATENT DOCUMENTS

| | | |
|---|---|---|
| 2002/0173074 A1 | 11/2002 | Chun-Jen et al. |
| 2003/0011302 A1 | 1/2003 | Palanisamy |
| 2004/0087061 A1* | 5/2004 | Ma et al. .................. 438/122 |
| 2005/0029673 A1 | 2/2005 | Naka et al. |
| 2007/0215927 A1 | 9/2007 | Kuramochi |
| 2007/0226993 A1 | 10/2007 | Liu et al. |
| 2009/0229513 A1 | 9/2009 | Hisada et al. |

* cited by examiner

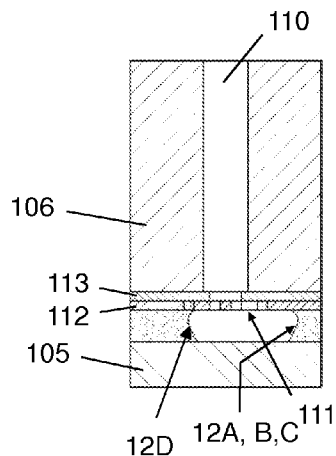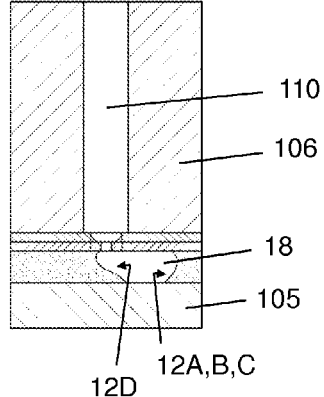
Fig. 12 (A)　　Fig. 12 (B)
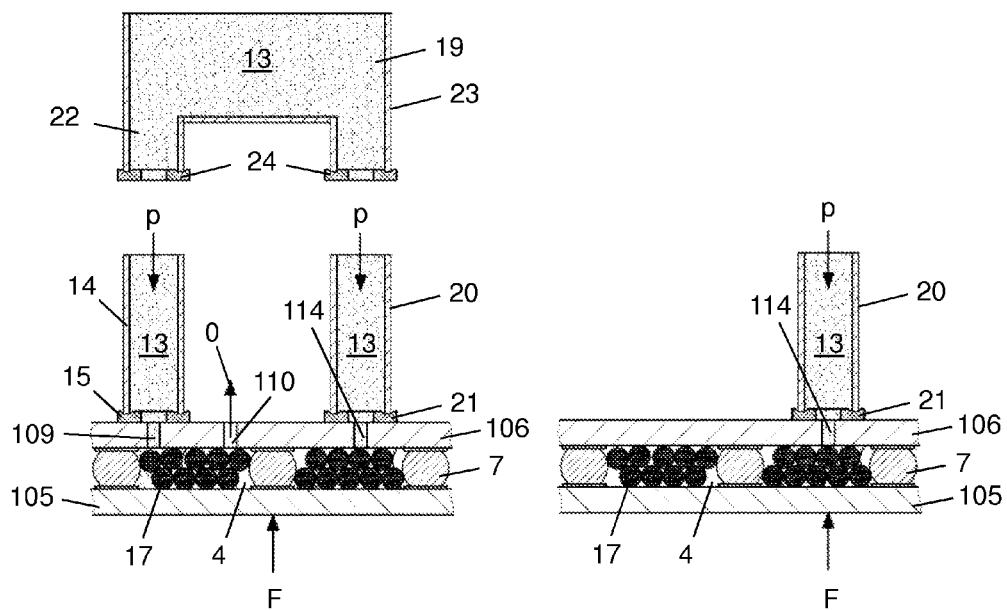
Fig. 13　　Fig. 14

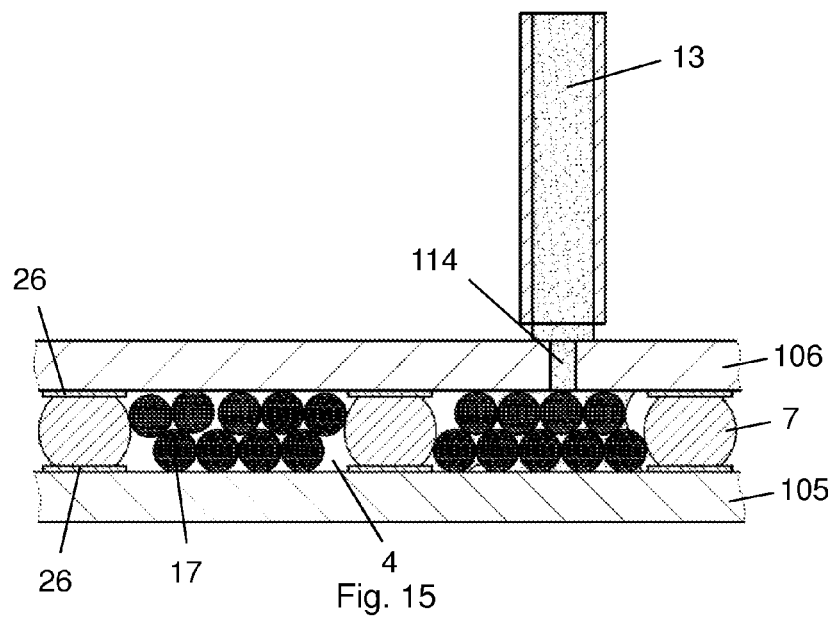
Fig. 15
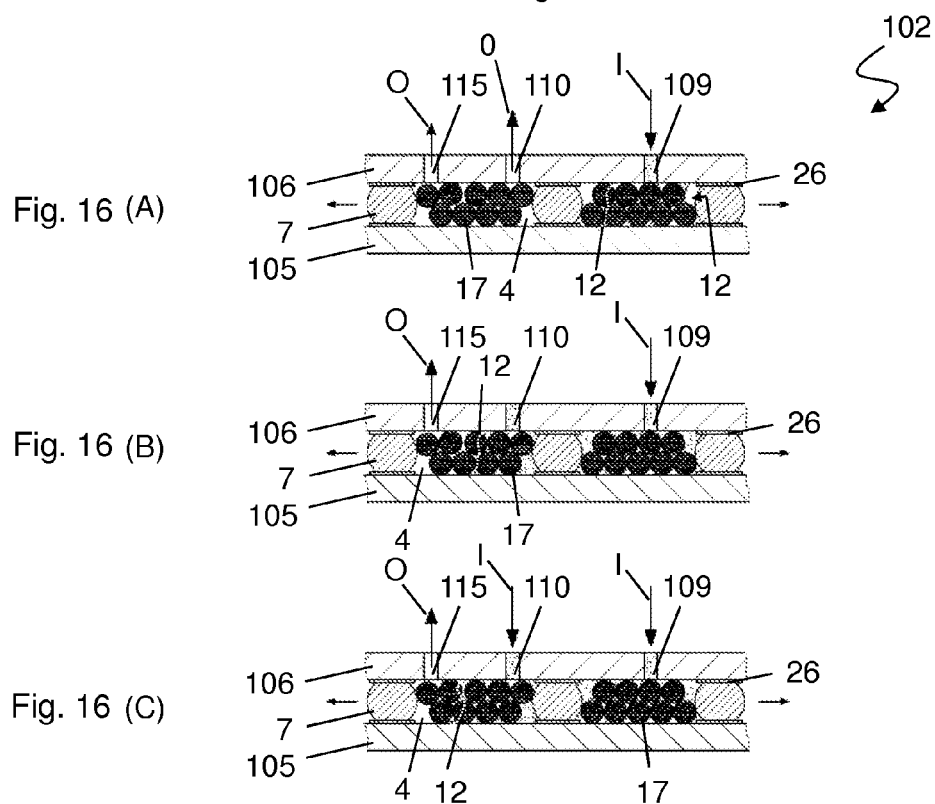
Fig. 16 (A)
Fig. 16 (B)
Fig. 16 (C)

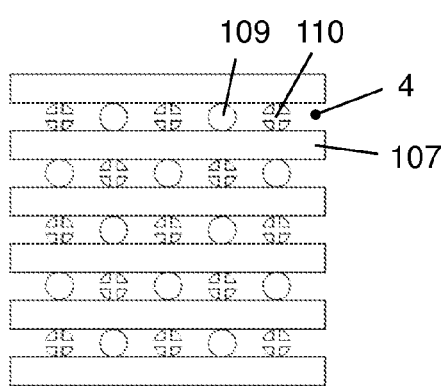
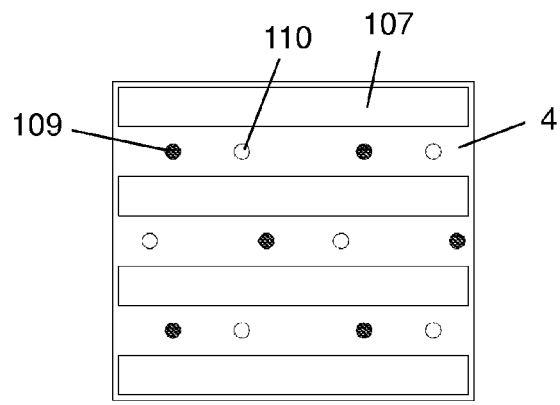
Fig. 19                              Fig. 20
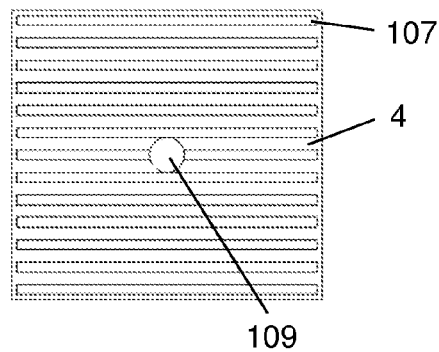
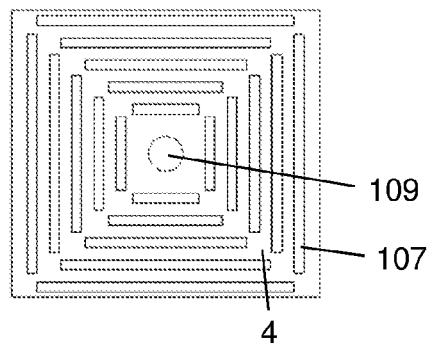
Fig. 21                              Fig. 22
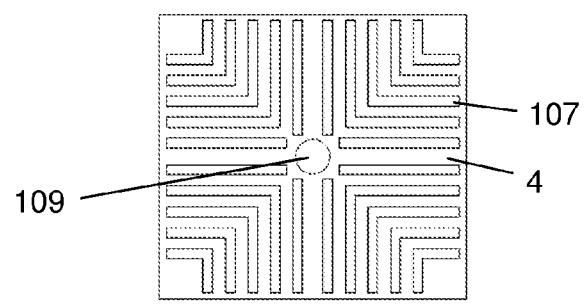
Fig. 23

MANUFACTURING AN UNDERFILL IN A SEMICONDUCTOR CHIP PACKAGE

PRIORITY

This application claims priority to Great Britain Patent Application No. 1213365.8, filed Jul. 27, 2012, and all the benefits accruing therefrom under 35 U.S.C. §119, the contents of which in its entirety are herein incorporated by reference.

BACKGROUND

This disclosure relates to methods for manufacturing a filling in a gap region or cavity between two surfaces, as for example an underfill for flip-chip packages. Further semiconductor chip packages and stacks are disclosed.

In modern electronic devices, substantial gains in performance are continuously achieved by means of circuit miniaturization and by the integration of single-package multi-functional chips. The scalability and performance of such electronic devices are related to their ability to dissipate heat. In typical flip chip arrangements, one integrated circuit (IC) surface is used for heat removal through a heat sink, while the other is used for power delivery and data communication. Power is delivered throughout solder balls attached to electrical pads on the IC chip that are reflowed and coupled to the main circuit board.

To minimize mechanical stress in the solder balls and to protect them electrically, mechanically, and chemically, the gap region between, for example, IC chip and board (created due to the presence of solder balls), is conventionally filled with electrically non-conductive materials, known as underfills. Current efforts towards 3D chip integration, with solder balls as electrical connection between silicon dies, demand high thermally conductive underfills to efficiently dissipate the heat of lower dies to the heat removal embodiment attached at the chip stack backside. Some flip-chip-on-board applications do also benefit from efficient heat dissipation from the semiconductor die into the board. Hence, thermal underfills between semiconductor and board are desirable.

Conventional underfills may consist of a curable matrix (e.g., epoxy resin) loaded with silica fillers, which have a similar thermal expansion coefficient (CTE) to that of the silicon. Currently, the requirement of matching CTE with the solder balls dictates the type, and volumetric fill of fillers to be employed in a given underfill. For thermal underfills the thermal conductivity of filler materials which are used to increase the thermal contact and enhance heat dissipation between connected surfaces should be high. Therefore, e.g., $Al_2O_3$, AlN, BN or other metal and nonmetal materials are used.

Conventionally, an underfill material is typically dispensed into a gap between chips or a flip chip and a substrate by injecting the filling material along the lateral sides of the gap. U.S. Pat. No. 6,214,635 discloses a method and an apparatus for underfilling the gap between a semiconductor device and a substrate by inclining the substrate and semiconductor and introducing filling material along a side wall or through one central hole in the substrate. The underfill then flows into the gap and forms an underfill.

SUMMARY

In one embodiment, a method for manufacturing an underfill in a semiconductor chip package having a cavity between a first surface and a second surface includes providing at least one access hole in one of the first or second surface; providing at least one vent hole in the one of the first or second surfaces; and applying a viscous filling material through the at least one access hole into the cavity thereby squeezing out air or gas through the at least one vent hole.

In another embodiment, a semiconductor chip package includes a cavity between a first surface of a first semiconductor chip and a second surface of a second semiconductor chip or substrate; at least one access hole in one of the first or second surface, wherein the access hole is adapted to guide a viscous filling material into the cavity; and at least one vent hole in the one of the first or second surfaces, wherein the vent hole is adapted to let out air or gas from the cavity.

BRIEF DESCRIPTION OF THE SEVERAL VIEWS OF THE DRAWINGS

FIGS. 9-12(A) and 12(B) show embodiments of flow fronts of viscous filler materials during the process of filling a cavity.

FIGS. 13-15 show details of another embodiment of a semiconductor chip stack having a cavity and illustrates method operations involved in filling the cavity with a thermal underfill in comparison to conventional filling methods.

FIGS. 16(A)-(C) show another embodiment of a method for filling a cavity in a semiconductor chip stack.

FIGS. 19-23 show embodiments for arrangements of vent holes, access holes and spacing elements for a cavity enabling novel solder patterns.

Like or functionally like elements in the drawings have been allotted the same reference characters, if not otherwise indicated.

DETAILED DESCRIPTION

Figure 1:
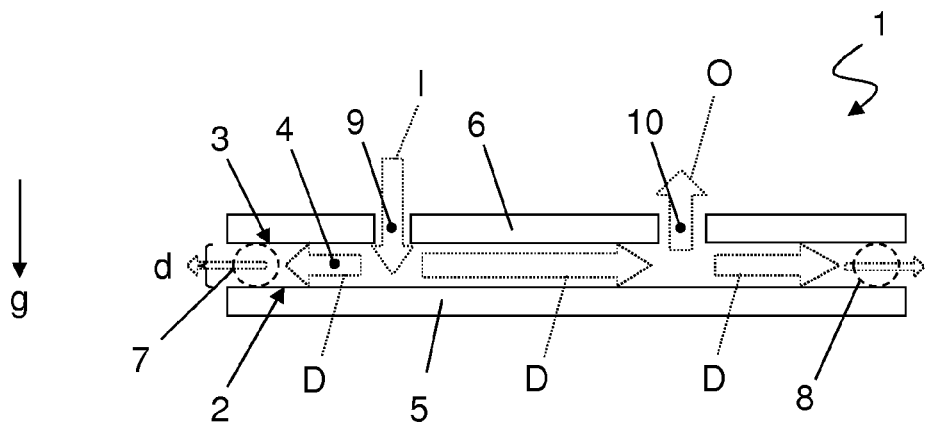
FIG. 1 shows a schematic diagram of an embodiment of a stacked surface arrangement and illustrates method operations involved in a method for manufacturing of a thermally conducting filling in a cavity between two surfaces.

It is desirable to perform such underfilling processes quickly and homogeneously, without voids, in order to obtain a robust thermal and mechanical coupling between the semiconductor chip and a substrate.

It is therefore an aspect of the present disclosure to provide for an improved method for manufacturing a thermally conducting filling in a cavity between two surfaces. It is another aspect of the present disclosure to provide for an improved stacked-surface arrangement.

According to an embodiment of a first aspect of this disclosure, a method for manufacturing an underfill in a semiconductor chip stack having a cavity between a first surface and a second surface is disclosed. The method includes: providing at least one access hole in one of the first or second surface; providing at least one vent hole in the one of the first or second surfaces, and applying a viscous filling material through the at least one entry hole into the cavity, thereby squeezing out air or gas through the at least one vent hole.

According to an embodiment of a second aspect a semiconductor chip package is provided comprising: a cavity between a first surface of a first semiconductor chip and a second surface of a second semiconductor chip or substrate; at least one access hole in one of the first or second surfaces wherein the access hole is adapted to guide a viscous filling material into the cavity; and at least one vent hole in the one of the first or second surfaces wherein the vent hole is adapted to let out air or gas from the cavity.

A combination of access holes and vent holes allows for an efficient filling of the cavity which becomes accessible through such holes. According to the embodied method and semiconductor chip stack, the viscous filling material is inserted perpendicularly to the lateral extension of the cavity.

The filling material or the underfill of the gap region is a thermally conducting filling. For example, the resulting thermal conductivity is sufficient to provide for a reliable heat transport from the first to the second surface if the surfaces are part of a chip flip arrangement. The thermally conducting filling can be an underfill between the surface of a substrate and the surface of an electronic element such as an integrated circuit chip, e.g., a microprocessor. One may also contemplate of underfills that serve predominantly mechanical needs, such as an improved stability.

The viscous filler material can comprise an epoxy resin that can be cured after being distributed in the cavity. The filling material may be a filling paste, a gel-like material, a liquid or fluid.

In embodiments of the method or the chip package of the first and the second surfaces are parallel to each other and essentially horizontally arranged. By arranging the surfaces and thereby the cavity horizontally viscous filling material can be homogeneously distributed during the filling process.

The semiconductor chip package can be a chip stack.

In embodiments of a method or of a semiconductor chip package, the access hole(s) and the vent hole(s) are arranged in parallel to each other and essentially vertically. By a vertical arrangement of the access hole, gravitational forces can be employed to create a downward flow of the viscous filling material. On the other hand, gas or air in the cavity can be squeezed out by the filling material as the filling material increasingly occupies the volume of the cavity. Usually, the filling material is heavier than air or gas such that the gas or air can exit the cavity through the one or more vent holes upwards.

In other embodiments of the method a transport of the filling material is mainly supported by capillary forces. Due to the viscosity of the material and the narrow dimensions of the cavity the material enters the region of the cavity and expands. The material front is defined by the surface tension of the viscous material.

In embodiments of the method or the semiconductor chip stack, a plurality of vent holes in the at least one of the first or second surface are provided. Multiple vent holes may lead to a more efficient filling and to a better drainage of enclosed air or gas by the viscous flowing filling material, as the distance to be filled from the access hole is reduced.

In embodiments of the method and the semiconductor chip package, the vent holes of the plurality of vent holes are arranged in a regular fashion. For example, the vent holes can be arranged in a cubic centric fashion or hexagonal fashion with respect to access holes.

The holes are arranged such that a void less filling occurs when the viscous filling material is inserted through the entry holes into the cavity and air or gas is squeezed out of the cavity through the vent holes. The vent holes, e.g., are placed at locations where the menisci of the different filling fronts join latest.

In other embodiments of the method or the semiconductor chip package, a plurality of access holes in the at least one of the first or second surfaces are provided. The access holes can be arranged in a regular geometric fashion.

In embodiments, the entry holes and the vent holes are arranged such that each vent hole has a group of nearest neighbor entry holes having the same distance from the vent hole.

In embodiments of the method or the semiconductor chip package, at least one vent hole comprises a filter element for withholding particles in the cavity. The filter element may withhold dispersed filler particles in a carrier fluid. One may contemplate of a viscous filling material having dispersed particles that are arranged between the first and the second surface and provide for thermal bridges. Such bridges can be seen as percolation paths of filler particles attached to each other. A filter element such as a filter mesh may withhold such particles and thereby induces networks of filler particles.

Embodiments may include filler particles that comprise at least one of the group of $Al_2O_3$, AlN, diamond, SiC, $SiO_2$, SiN, graphite and/or BN. The filler particles may comprise a thermally conducting and electrically insulating material.

In further embodiments of the method or the semiconductor chip package, at least one vent hole comprises a moderating element for slowing down a flow front of the viscous filling material towards a center of the vent hole, by e.g., providing additional reservoir or acting as a capillary valve. The moderating element, for example, can be a rim or ridge around the hole facing towards the cavity. By slowing down the flow front, the creation of voids or enclosures of air or gas can be minimized.

In embodiments of the method for manufacturing an underfill, the optional operation of generating a flow of the viscous filling material from the at least one access hole to the at least one vent hole can be performed. Further, there may be several flows generated between access holes and vent holes. By generating a flow of the viscous material, the cavity can be filled more quickly.

In embodiments of the method, a plurality of access holes in the at least one of the first or second surface is provided, and the viscous filling material is applied through all access holes into the cavity contemporaneously.

The method includes applying the viscous filling material through the access holes such that flow fronts of the viscous filling material reach a vent hole essentially at the same time, thereby squeezing a gas or air enclosure through the vent hole or the plurality of vent holes. The application of the viscous filling material or the flow of the viscous filling material may be controlled, for example, by applying an appropriate flow velocity or pressure difference between the cavity or capillary forces and an optional reservoir for the viscous filling material.

Embodiments of the method comprise: after applying the viscous filling material through the at least one access hole and squeezing out air or gas through a predetermined vent hole, applying the viscous filling material through the predetermined vent hole into the cavity as well thereby employing the predetermined vent hole as an access hole. One may sequentially use holes in the surface first as vent holes and consequently as access holes.

In embodiments of the methods, providing a vent hole and/or providing an entry hole comprises at least one of the processes of drilling, etching or laser ablation. For example, a laminate or substrate or a portion of a semiconductor chip can be drilled through, etched or punched and drilled through by employing lasers.

Embodiments of the semiconductor chip package may comprise a plurality of solder balls having a predetermined diameter, bumps or rails having a predetermined height for spacing the first and second surface from each other.

Embodiments of the chip package may comprise thermally conducting filling material that partially fills the cavity, the vent holes or the access holes. In embodiments, the semiconductor chip stack is a flip chip package.

Embodiments of the method or the semiconductor chip package allow for unusual solder geometries. For example, vent holes and/or access holes can be placed at positions that allow the filling of irregular gap or cavity geometries. The cavity can comprise channels or regions enclosed by solder structures that provide for the spacing of the surfaces.

Certain embodiments of the presented method for manufacturing an underfill or of the semiconductor chip package may comprise individual or combined features, method operations or aspects as mentioned above or below with respect to exemplary embodiments.

The term "viscous filler material" refers to a material or material composition that can flow through a hole or in a cavity or gap. One can also refer to a filling agent, a paste, or a liquid. The viscous filler material essentially forms a closed flow front that expands with the volume of the material. The filling material may include a carrier fluid having suspended particles. Hence, the material composition can have a plurality of ingredients having different phases, e.g., liquid and/or solid particles.

As used herein, the term "filler particles" refers to particles of essentially any shape than can be used for filling a void space. The filling particles can be small pieces or bits of a solid material. The filling particles can be embedded in a matrix.

The expression "hole" in connection with vent hole or access hole refers to a structure that allows a transport of the filler material through a board or plate-like element. The hole can also be called a through-hole, a channel, a duct, a via or an opening. The hole may comprise side-walls. The access hole can be called entry or insertion hole or port of the cavity or gap. In certain contexts the vent hole is called a drainage port.

A "cavity" or gap in a chip stack is a volume between two surfaces that are spaced with respect to each other. The volume has usually a much larger lateral extension that its height or thickness. The cavity can have lateral sides that are open. However, the sides can be limited by side-walls or other structural elements as well.

It is understood that, in the following, only sections or parts of stacked-surface structures are shown. In actual embodiments the depicted structures would extend through the paper plane and continue further than shown in the schematic drawings.

FIG. 1 shows a schematic diagram of a first embodiment of a stacked-surface arrangement and illustrates method operations involved in the manufacturing of a thermally conducting filling in a gap region between two surfaces. FIG. 1 shows cross-sectional views of a two-surface arrangement.

Referring to FIG. 1, a schematic diagram of a stacked surface arrangement 1 is shown for illustrating method operations involved in the process of filling a cavity between two surfaces. The stacked surface arrangement 1 can be part of a flip-chip package or a bumped dye technology semiconductor chip. FIG. 1 shows two board-like structures 5, 6 with surfaces 2, 3 facing towards each other. For example, a board or bar 6 is a substrate or a chip carrier. The board or bar 5, for example, can be a flip chip coupled to the substrate 6 for example by bumps or solder balls 7, 8 that define the spacing distance d between the two surfaces 2, 3. The substrate or laminate 6 can be a printed circuit board comprising ceramic, silicon, glass, polymers, copper or combinations thereof. Other materials can be contemplated. In multiple chip stacks, the board 6 can also be a functional semiconductor chip like a DRAM or the like.

There is a gap or cavity 4 between the two surfaces 2, 3. In order to enhance the integrity of the flip chip package 1 and improve the cooling of the active semiconductor chip 5, a thermally conducting underfill is desired within the gap 4. Other embodiments, for example, call for mechanical stability, and hence a dense and void less filling is desired. In the embodiment depicted in FIG. 1, one of the surfaces 3 is provided with an access or entry hole 9. Further, a vent hole 10 is provided in the same surface 3. For example, the upper bar 6 being a laminate board can be mechanically or chemically treated for forming holes 9, 10.

The underfilling of the gap or cavity 4 is accomplished by applying a viscous filling material through the access hole 9 of the laminate bar 6 essentially vertically. During the filling process, the stacked surface structure 1 is placed and arranged horizontally, i.e., the holes 9, 10 extend along gravity g. The underfilling or filling material has viscous properties and can be, for example, a resin. As indicated by the dotted arrows I, filling material is inserted through the hole 9 into the gap region 4.

The filling material enters the gap or cavity 4 mainly due to capillary forces. The viscosity of the filling material and the spacing d lead to a capillary pressure such that the filler material expands into the cavity 4.

Due to the upper and lower confinement by the surfaces 2, 3, the viscous filling material flows and is distributed in the cavity along the dotted arrows D. There is a portion running to the left towards a lateral side of the surface structure 1. Another portion runs to the right and fills the volume of the gap. The volume of the cavity 4 is occupied by the filler material which expands along the cavity and spreads out.

As usually the gap 4 is filled with gas or air, the propagation of the filling material can be slightly obstructed by the air or gas. Therefore, the vent hole 10 is provided through which air present in the cavity 4 can exit upwards. This is indicated by the dotted arrow O. As a result, the viscous filling material can expand within the volume of the gap or cavity 4, and squeezes out air or gas by means of its flow front through the vent hole 10.

Further, the filling material may exit through the sides of the stacked surface arrangement 1. One can provide barrier elements at the edges that close the cavity laterally.

In an optional curing operation, the filling material is cured, thereby forming a relatively solid and thermally conducting underfill which is homogeneously distributed without any air or gas voids. Due to the vent hole 10, the filling process can be accelerated with respect to conventional filling methods where filling material is inserted from a side from the stacked surface arrangement. In principle, a plurality of entry holes 9 and a plurality of vent holes 10 can be provided. Then, the underfill material can be directly applied into the gap region and has to flow only a short distance in order to expand into the voids of the gap or cavity 4.

Figure 2:
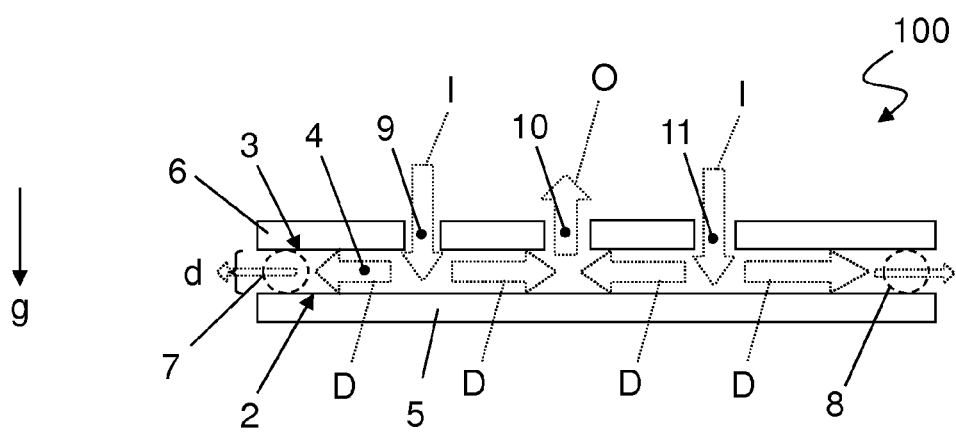
FIG. 2 shows a schematic diagram of another embodiment of a stacked surface arrangement and illustrates method operations involved in a method for manufacturing of a thermally conducting filling in a cavity between two surfaces.

FIG. 2 shows a cross-sectional view of another embodiment of a stacked surface arrangement 100. The stacked surface arrangement 100 has a similar structure as shown in FIG. 1. There is a lower board 5 and another board 6 spaced, for instance, by solder boards 7, 8. Between facing surfaces 2, 3 of the two boards 5, 6, a gap region cavity or initially void volume is provided. The upper board 6 is provided with two access holes 9, 11 and one vent hole 10. The holes extend along gravity g, while the stacked surface arrangement 100 is placed horizontally.

During the process of filling the gap 4, viscous filling material is applied or inserted through the access holes 9, 11 into the gap region 4. In the area below the two access holes 9, 11, the inserted underfill or filling material expands into the volume of the cavity or gap 4. This is indicated by the dotted arrows D. The filling material is applied through the two access holes 9, 11 such that flow fronts essentially reach the vent hole 10 at the same time. By doing so, a risk of creating voids of enclosed air or gas is reduced. The initial gas or air in the cavity is squeezed out of the cavity 4 by the flow fronts of the inserted filling material. A part of the filling material may also exit through the vent hole 10.

First, by using and providing several access holes in one of the surfaces 2, 3, filling material such as viscous epoxy resin can be applied directly into the gap region and does not need to flow from a side edge along the entire extension of the gap to the opposite side edge. The one, or optionally a plurality of vent holes 10, allow for an essentially homogenous underfill material that is free from air pockets, bubbles or voids within the underfill material.

Figure 3:
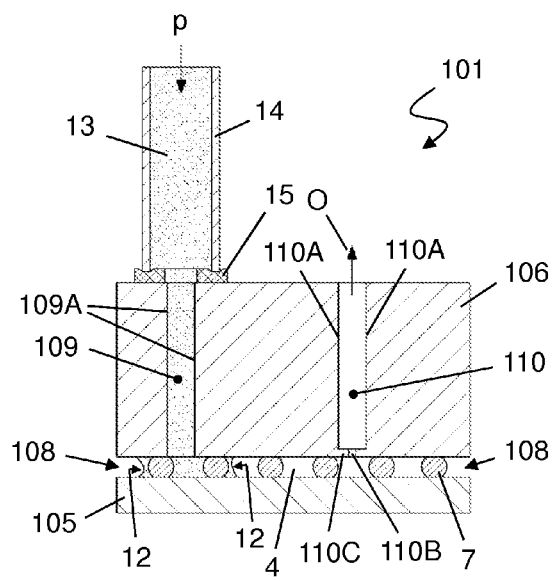
FIGS. 3-5 show details of an embodiment of a semiconductor chip stack having a cavity and illustrates method operations involved in filling the cavity with a thermal underfill.
Figure 4:
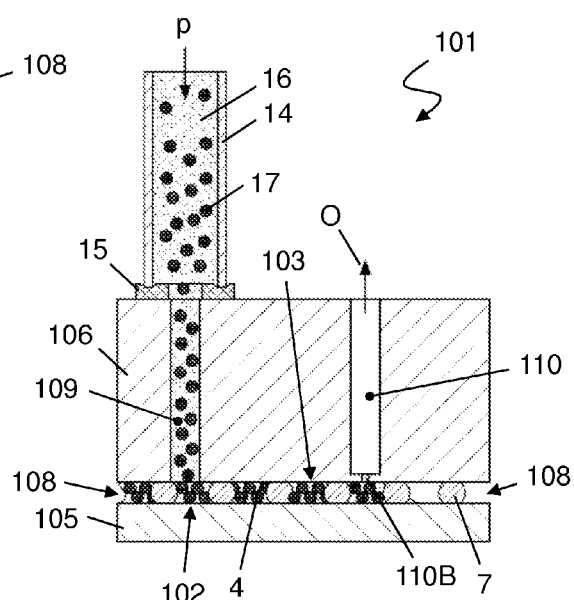
Figure 5:
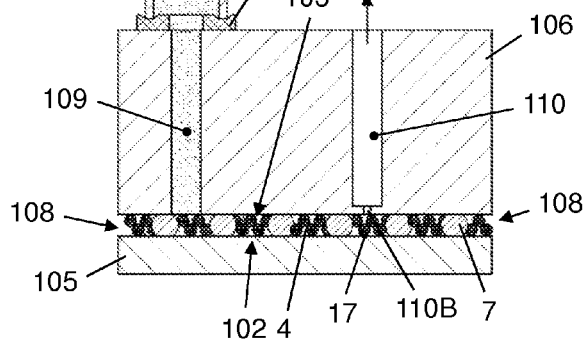

FIGS. 3 through 5 show details of a further embodiment of a semiconductor chip stack with a cavity or gap and illustrate a process of filling the gap. The features shown in the figures may repeat themselves periodically. Hence there may be more than a pair of vent and access holes present. For the sake of simplicity, two holes are shown. FIGS. 3-5 show cross-sectional views of a semiconductor chip stack 101. As shown with respect to FIG. 1, the cavity can be filled with a thermally conducting resin. The Figures show a semiconductor chip 105 which is attached through a solder balls 7 to a laminate or substrate 106. The laminate 106 is provided with holes 109, 110. In the orientation of FIGS. 3-5, the left hole 109 is used as an access hole to the cavity 4. The right hole 110 serves as a vent hole and allows the drainage of air out of the cavity 4. For example, the access hole 109 and vent or drainage hole 110 have a cylindrical form with cylindrical side walls 109A, 110A. For example, the solder balls 7 can have a diameter of approximately 60 μm, thereby forming a gap height of 60 μm. The top substrate 106 can have a thickness of about 500 μm. Hence, the access and vent holes 109, 110 can be regarded as a channel or port having a length of 500 μm.

FIG. 3 illustrates a dispenser tube 14 which is coupled by means of a coupling seal 15 to the top end of the access holes 109 in the substrate 106. The dispenser tube 14 is filled with filling material 13 which is supplied through the channel or access hole 109 into the gap region 4. As a result, the filling material 13, due to its viscosity and capability to flow, enters the gap 4 and expands starting from the entry point of the access hole 109 in the gap 4. The expansion is assisted by capillary forces and optionally by applied pressure. In FIG. 3, flow fronts 12 are indicated. By applying a dedicated pressure P to the viscous filling material 13, the expansion of the filling material 13 in the gap 4 is enhanced.

Eventually, air in the gap 4 exits through an aperture 110B of the vent hole 110 upwards. This is indicated by arrow O. In the vicinity of the connection between the vent hole 110 and the gap or cavity 4, a tapering structure 110C reduces the aperture of vent hole 110. The reduction of the cross-section of the vent hole can be regarded as a filter. For example, as shown in FIG. 4, in an alternative embodiment, a carrier fluid 16 includes filler particles 17 and is injected through the access hole 109 into the cavity 4. The filler particles 17, which are initially immersed in the carrier fluid, are held at the filter or tapered aperture 110B of the vent hole 110. As a result, the filler particles may form percolation paths between the lower and upper surface of the chip 105 and substrate 106 respectively. Such percolation paths or filler particles 17 attached to each other provide for an enhanced thermal conductivity between the two parts 105 and 106. At the side edges 108 of the cavity 4, additional filter elements can be placed or one lets the carrier fluid with the filler particles 17 exit the gap region 4. After forming network of filler particles 17, the voids between the filler particles 17 can be filled with a resin. After curing, the resin stabilizes the structure and leads to a better mechanical property of the semiconductor chip stack 101. Alternatively, a resin can act as a carrier fluid 19 and remains together with the filler particles 17 in the gap 4. The, the filling material comprises carrier fluid 16 and filler particles 17.

FIG. 5 indicates the clustered or percolated filler particles 17 in the right-hand section of the cavity 4. Next, similar to the process depicted with respective FIG. 3, an underfill material is inserted through the access hole 109 into the cavity including the filler balls or particles 17. Additionally to the effect of capillary forces, by applying a dedicated pressure P to the filler material 13, the voids in the gap region 4 are filled with the filler material 13. Potentially captured air is squeezed out of the gap or cavity region 4 through the vent hole 110. Additionally, air can exit through the side edges 108 of the cavity.

Generally, the cavity may comprise filler particles, a porous medium or other structural elements like spacers or the like.

The dispenser tube 14 can be part of a filling tool that can be docked to the access hole or holes 109 by means of a coupling seal 15. The holes 109, 110 are arranged essentially vertically in parallel with gravity, while the gap extends essentially horizontally.

Figure 6:
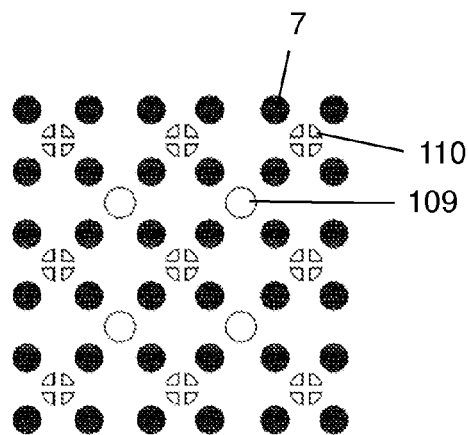
FIGS. 6-8 show embodiments for arrangements of access and vent holes for a cavity.
Figure 7:
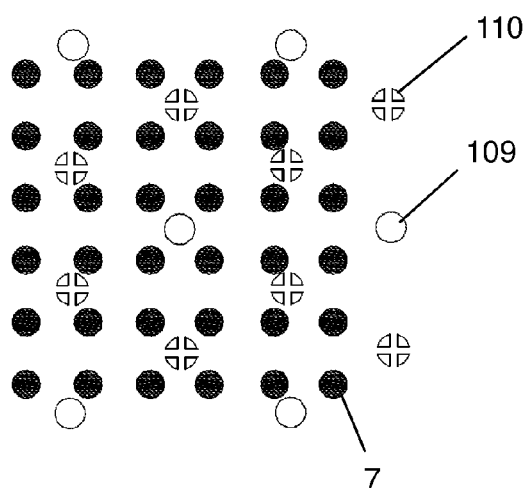
Figure 8:
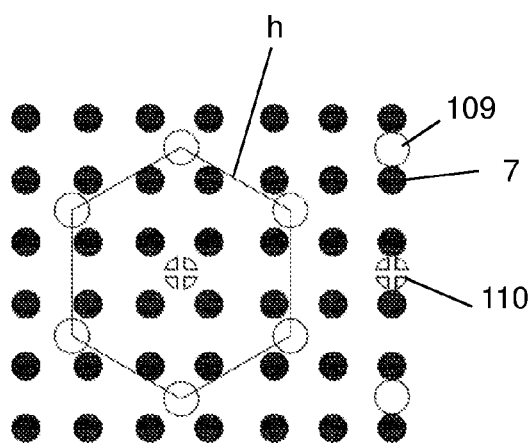

FIGS. 6-8 show embodiments for the arrangement of access and vent holes for a cavity in a plan view. FIGS. 6-8 illustrate a rectangular section of a cavity in a plan view. Vent holes 110 are illustrated as circles with a cross. Solder balls 7 are illustrated as grey circles, and access holes or ports are illustrated as solid circles 109. The access ports or holes 109 and vent holes or drainage ports 110 are arranged such that no air trapping shall occur when the viscous filling material is inserted and pushed into the cavity through the access holes or ports 109.

For example, FIG. 6 shows a face centered cubic arrangement of vent holes 110 and access holes 109. FIG. 7 shows a hexagonal geometry of vent holes or drainage ports 110 with respect to access holes or access ports 109. FIG. 8 shows a hexagonal arrangement of access holes 109 with respect to drainage holes 110.

Figure 9:
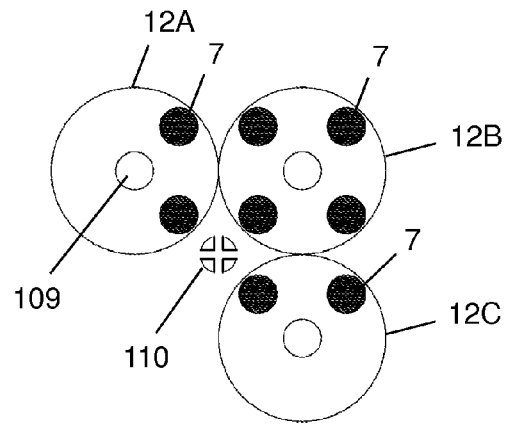

It is desirable to distribute the vent holes and access holes such that flow fronts stemming from filling material inserted through different access holes do not form enclosures for air that do not reach a respective vent hole. FIG. 9 illustrates a propagation of viscous filler material inserted through face center cubic access holes as shown in FIG. 6. Filler material is inserted into the cavity through holes 109. Ideally, the flow fronts correspond to expanding circles 12A, 12B and 12C. In the illustration of FIG. 9 it is assumed that the solder balls only pose a minor hindrance to the flow fronts 12A, 12B, 12C. Eventually, the flow fronts 12A, 12B and 12C touch each other and merge. Around the central vent hole 110, an enclosure of air that needs to be pushed through the vent hole 110 develops.

Figure 10:
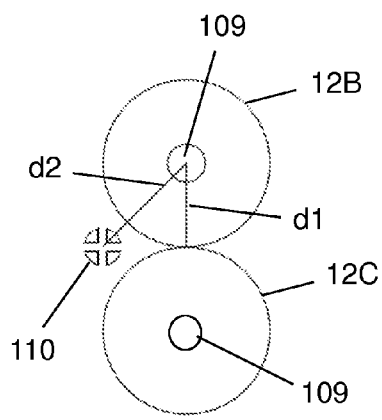

FIG. 10 shows the distance between the vent hole 110 and access hole 109. The radius of the flow front 12B when touching flow front 12C is d1. In one example, the flow fronts 12B and 12C reach the vent hole 110 contemporaneously, i.e., at the same time. The shortest distance d2 to the next vent hole 110 is for example by √2 larger than the distance d1 to the next flow front.

Figure 11:
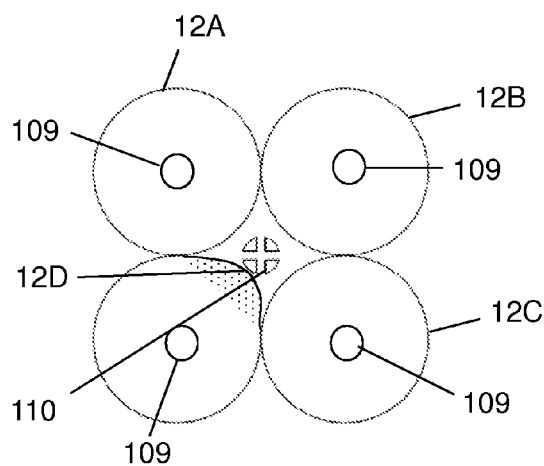

FIG. 11 shows a configuration four flow fronts 12A, 12B, 12C, 12D. Flow front 12D reaches vent hole 110 earlier than the other flow fronts 12A, 12B and 12C. In this configuration shown in FIG. 11, a void or bubble can occur because the vent hole 110 is potentially clogged by the filling material of flow front 12D. In order to avoid such situations, one may provide a moderating element around the vent holes 110. This is depicted in the cross-sectional view of FIG. 12. FIG. 12(A) shows a section of a semiconductor chip stack and in particular a vent hole 110 through substrate 106 on which a semiconductor chip 105 is attached. The side of substrate 106 facing towards the chip 105 is provided with a dielectric layer 113 and a plating 112, for example a copper plating or laminating. Around the vent hole 110, a ridge or rim 111 is formed by the plated copper. The rim slows down the flow front 12 approaching the vent hole 110. Thereby, the meniscus of the flow front acquires a ring-type shape around the vent hole 110. Referring back to FIG. 11, the rim or ridge 111 slows down flow front 12D such that the other flow fronts 12A, 12B and 12C can close the ring around vent hole 110. As a result, the flow fronts 12A, 12B, 12C, and 12D can contemporaneously exit the cavity and squeeze out first the enclosed air in the cavity.

FIG. 12B shows a configuration without a flow front moderating means, such as the rim 111. It might occur that flow front 12D enters the vent hole 110 before flow fronts 12A, 12B, 12C reach the vent hole 110. As a result, the vent hole 110 is plugged by the filling material 12 forming the flow front 12D such that an air or gas enclosure 18 is created.

FIG. 13 shows another embodiment of a semiconductor chip stack having a cavity and illustrates the method operations involved in filling the cavity. The structure is similar to the configuration shown in FIG. 2. The functional semiconductor chip 105 is attached to a substrate 106 through solder balls 7. Hence, between the two board-like structures 105 and 106 is a cavity 4. As explained before with respect to FIGS. 4 and 5, filler particles 17 are introduced in the cavity. The substrate 106 has two access holes 109 and 114 and one vent hole 110 in-between.

There are dispenser tubes 14, 20 coupled to the access holes 109 and 114, respectively, by means of coupling seals 15, 21. The filler material 13 is provided by a filling tool having a reservoir 19 and two dedicated connector pieces 22, 23 with seals 24 to couple with the dispenser tubes 14, 20, respectively. To accomplish a filling of the cavity 4 with the filling material 13, the filling tool is attached to the dispenser tubes 14, 20, and filling material 13 is pressed into the cavity 4 through the access holes 109 and 114. Then, excess air or gas exits from the cavity 4 through the vent hole 110 until the flow fronts reach the vent hole 110, and filler material 13 exits also through vent hole 110. As a result, the cavity is completely underfilled. A force F is applied from underneath to stabilize and couple the reservoir securely to the dispenser tubes.

In contrast to conventional methods where, for example, only one access hole is present, the amount of filler material that can be applied contemporaneously is increased in the configuration of FIG. 13. In FIG. 14, only one access hole 114 is provided, and a dispenser tube 20 coupled by means of a coupling seal 21. The filler material 13 is pressed into the cavity and can exit the cavity 4 through the open edges. A similar configuration is shown in FIG. 15 where a loose dispenser 25 is attached to an access hole 114 without any seals.

FIG. 16 shows an embodiment of a semiconductor chip stack arrangement similar to the one shown in FIG. 13. FIG. 16 also illustrates a variant of a method for providing an underfill in the cavity between bar- or board-like surfaces in a chip stack. In FIG. 16, also aspects of another process for providing the underfill is illustrated in terms of the sequence (A), (B), (C). In FIG. 16, the reservoir or filling tool for providing the filler material is omitted. The general structure of the chip stack 102 includes a functional semiconductor chip 105 and a substrate 106. The substrate 106 can be a laminated substrate. There is a thermal and electric coupling between the functional semiconductor chip 105 and the board or laminate 106 in terms of solder balls 7 which are attached to pads 26. There are pads 26 provided on both surfaces of the semiconductor chip 105 and the board 106, respectively. In all Figures (A), (B) and (C), filler particles, for example alumina, are distributed in the cavity.

In a first process shown in top FIG. 16(A), filler material is inserted through the right-hand access hole 109. As a result, flow fronts 12 extend to the left and right of the access hole 109. The flow front or meniscus 12 is indicated by the white dotted line. The inserted material is indicated by the arrow I. In particular, the left flow front 12 propagates to the left and reaches vent hole 110 while the gas or air exits through the vent holes 110 and 115. This is shown in terms of arrows O. For example, the vent holes 110 and 115 are monitored, and at the time when filler material reaches the first vent hole 110, the supply or insertion of additional filler material at access hole 109 is stopped. The situation is shown in FIG. 16B in the middle. One may also continuously dispense filler material through the access hole 109.

Next, filler material is applied also to vent hole 110, thereby functioning as an access hole 110. This is shown in FIG. 16C. By applying filler material through the converted vent hole 110 and the actual access hole 109, more filler material can be inserted into the cavity. The flow front 12 now further extends towards the second vent hole 115. The process can be repeated at vent hole 115 when the entire region between vent hole 115 and access hole 109 is filled with filler material.

Figure 17:
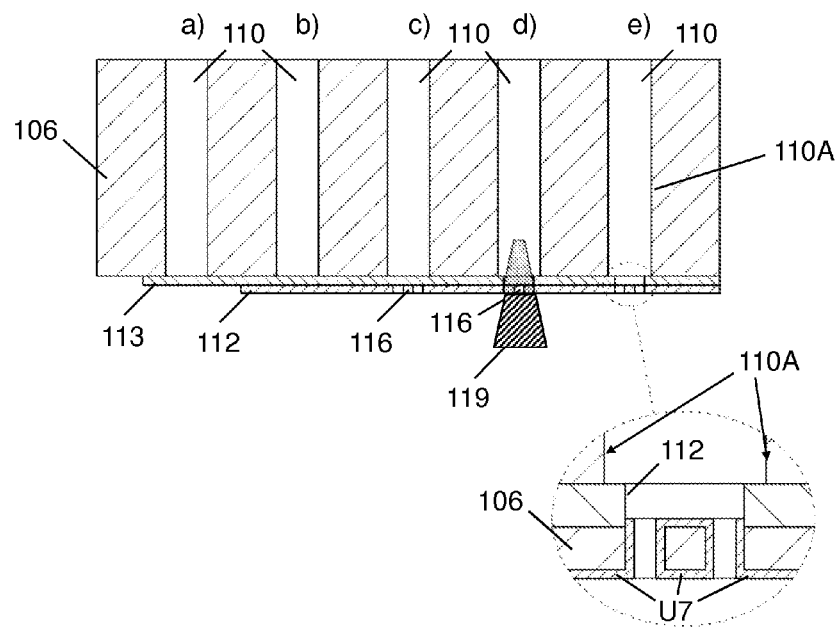
FIGS. 17 and 18 show embodiments of access and vent holes in semiconductor chip stacks and illustrate method operations involved in manufacturing holes.
Figure 18:
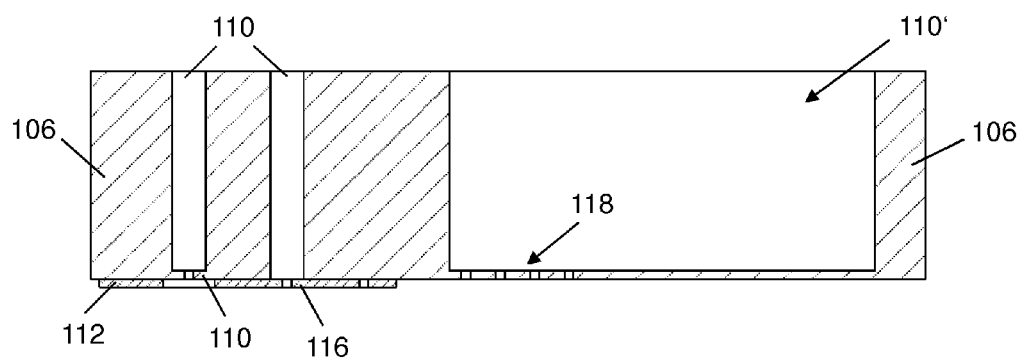

One can further enhance the functionality of a chip stack having vent and access holes, and the method for providing an underfill in the cavity below the holes. FIGS. 17 and 18 show embodiments of access and vent holes in a semiconductor chip stack. FIG. 17 shows from left to right a) through e) process states of the manufacturing of vent holes 110 in a laminate 106.

First, a substrate or laminate 106 is provided. Additionally, a hole, via or through-hole is drilled into the laminate material. A dielectric layer 113 is also laminated onto the substrate 106. This can be done before or after drilling the hole. The structure is shown in a). Instead of drilling completely through the material 106 one may also leave a thin material sheet.

In a next operation, a copper plating 112 is provided on the dielectric 113. This is depicted in FIG. 17 section b). One may also employ a copper lamination process.

In order to provide for a filter element or filter mesh that withholds potential filler particles as shown for example in FIG. 4, a copper mesh 116 is, for example, etched through the copper layer 112. This is shown in FIG. 17 section c).

In order to make the end structure of hole 110 permeable for air or carrier fluid or filler material, the dielectric 113 is removed. This can be done, for example, by laser ablation or other appropriate methods. 119 indicates laser light. As a result, a vent hole 110 having filter mesh is realized as illustrated in section d) of FIG. 17.

In order to reduce the mesh aperture, one can optionally perform an additional plating process. This is illustrated in section e) of FIG. 17. The enlarged portion shows the aperture of vent hole 110. The copper mesh is additionally plated and thereby increased in dimension. This is indicated by the plated cover 117 around the copper 116. A similar copper mesh can also be formed at the side walls of a cavity in order to withhold dispersed filler particles in a carrier fluid.

FIG. 18 shows variations of vent and/or access holes. FIG. 18 shows exemplary narrow access or vent holes 110 to the left. For example, the vent holes 110 have a cross-section or diameter of approximately 100 to 1000 µm. The left vent hole 110 in the substrate has a reduced aperture or mesh 110C having, for example about 15-20 µm. A copper plating is provided to realize a rim or ridge around the vent hole 110 to the left. The central vent hole 110 has only a copper plating 116 to reduce the aperture in terms of a mesh. The right-hand side hole 110' in the substrate has a wider cross-section of for example 1 mm and provides for a multiplicity of smaller access holes 118 that can be regarded as a substrate mesh. One can also contemplate of other geometries and dimensions for the access and/or vent holes.

FIGS. 19-21 show embodiments for arrangements of vent holes, access holes and spacing elements for a cavity. While solder balls as spacing elements are widely used in flip chips or chip stack arrangements, one can also contemplate of other geometries for bumps, as for example rails, load copper. FIG. 19 shows solder rails 107 that are used for electric and/or thermal coupling between stacked chips or board-like elements. Thereby, channel-like cavities 4 are formed. In each of the channel enter vent holes 110 and access holes 109. A similar configuration is shown in FIG. 20; however, the rails have a larger dimension and are wider than the access holes 109 and 110 in the cavities 4 between rails 107. In particular, the use of access holes and vent holes through one of the surfaces defining the cavity allows for an efficient filling of the cavities in the chip stack. Conventional methods would need to insert filler material from the open sides of the channels 4. As an extreme, the vertical access and vent holes would allow for closed solder features like rings or squares, which cannot be filled from the chip periphery. Hence, the proposed filling processes allow for novel geometries for solder and spacing structures.

FIGS. 21-23 illustrate rail patterns where a plurality of access ports are advantageous to provide an underfill. FIG. 21 shows narrow cavities or channels 4 between rails 107. A single access port as shown in FIG. 21 could not accomplish the complete filling of the plurality of cavities. Similarly, the structure shown in FIG. 22 would call for multiple access holes through one of the surfaces confining the cavity. Finally, the geometry shown in FIG. 23 with cross-like rails 107 and distinct channels or cavities 4 would also call for a plurality or access holes through one of the confining surfaces and through the substrate.

In summary, this disclosure provides for an efficient method and apparatus for providing a homogeneous underfill in particular in chip stacks or flip-chip arrangements. The disclosed embodiments for filling methods allow for a high particle loading in gaps. The realization of vertical access holes and vent holes through a plane parallel to a cavity extension allows for an efficient and quick underfill process. Although the figures depict cross-sections or plan views of details of stacked surface arrangements including a limited number of holes, it is understood that embodiments may comprise more elements like through-holes, spacer elements, substrates, chips etc. than shown in the drawings. Therefore the mentioned numbers or holes or other elements refer to the detailed views only. It is further understood that that the various aspects, as for example shown in FIGS. 17 and 18 with respect to the vent holes and/or access holes, can be combined with other aspects shown in connection with the embodiments of chip stacks or the like.

The invention claimed is:

1. A method for manufacturing an underfill in a semiconductor chip package having a cavity between a first surface and a second surface, the method comprising:
   providing a plurality access holes in one of the first or second surface;
   providing a plurality vent holes in the one of the first or second surfaces; and
   applying a viscous filling material through at least one of the plurality of access holes into the cavity thereby squeezing out air or gas through at least one of the plurality of vent holes;
   wherein the access holes and the vent holes are arranged such that each vent hole has a group of nearest-neighbor entry holes having the same distance from the vent hole.

2. The method of claim 1, further comprising arranging the first and the second surface parallel to each other and essentially horizontally.

3. The method of claim 1, further comprising arranging the access hole and the vent hole parallel to each other and essentially vertically.

4. The method of claim 1, further comprising generating a flow of the viscous filling material from the at least one access hole to the at least one vent hole.

5. The method of claim 1, wherein the applying comprises inserting the viscous filling material downwards in the direction of gravity.

6. The method of claim 1, further comprising applying the viscous filling material through the access holes such that flow fronts of the viscous filling material reach a vent hole essentially at the same time thereby squeezing a gas or air enclosure through the vent hole or the plurality of vent holes.

7. The method of claim 1, wherein providing a vent hole and/or an access hole comprises at least of the processes of: drilling, etching, or laser ablation.

8. The method of claim 1, wherein the first surface and the second surface are spaced by a plurality of solder balls having a predetermined diameter or bumps or rails having a predetermined height.

9. A method for manufacturing an underfill in a semiconductor chip package having a cavity between a first surface and a second surface, the method comprising:
   providing at least one access hole in one of the first or second surface;
   providing at least one vent hole in the one of the first or second surfaces; and
   applying a viscous filling material through the at least one access hole into the cavity thereby squeezing out air or gas through the at least one vent hole;
   wherein at least one vent hole comprises one of: a filter element for withholding particles in the cavity, and a moderating element for slowing down a flow front of the viscous filling material towards a center of the vent hole.

10. A method for manufacturing an underfill in a semiconductor chip package having a cavity between a first surface and a second surface, the method comprising:
   providing at least one access hole in on of the first or second surface;

providing at least one vent hole in the one of the first or second surfaces;

applying a viscous filling material through the at least one access hole into the cavity thereby squeezing out air or gas through the at least one vent hole; and after applying the viscous filler material through the at least one access hole and squeezing out air or gas through a predetermined vent hole, applying the viscous filler material through the predetermined vent hole into the cavity as well thereby employing the predetermined vent hole as an access hole.

11. A method for manufacturing an underfill in a semiconductor chip package having a cavity between a first surface and a second surface, the method comprising:

providing at least one access hole in on of the first or second surface;

providing at least one vent hole in the one of the first or second surfaces;

applying a viscous filling material through the at least one access hole into the cavity thereby squeezing out air or gas through the at least one vent hole; and applying a carrier fluid having immersed filler particles, wherein the filler particles remain in the cavity and arrange according to capillary or convective forces.

12. A semiconductor chip package, comprising:

a cavity between a first surface of a first semiconductor chip and a second surface of a second semiconductor chip or substrate;

at least one access hole in one of the first or second surface, wherein the access hole is adapted to guide a viscous filling material into the cavity; and at least one vent hole in the one of the first or second surfaces, wherein the vent hole is adapted to let out air or gas from the cavity, and wherein at least one vent hole comprises one of: a filter element for withholding particles in the cavity, and a moderating element for slowing down a flow front of the viscous filling material towards a center of the vent hole.

13. The semiconductor chip package of claim 12, comprising a plurality of access holes and a plurality of vent holes in the at least one surface.

* * * * *